United States Patent [19]

Kurz et al.

[11] 3,784,847

[45] Jan. 8, 1974

[54] DIELECTRIC STRIP ISOLATION FOR JFET OR MESFET DEPLETION-MODE BUCKET-BRIGADE CIRCUIT

[75] Inventors: Bruno Kurz, Schenectady; Mark B. Barron; Walter J. Butler, both of Scotia, all of N.Y.

[73] Assignee: General Electric Company, Schenectady, N.Y.

[22] Filed: Oct. 10, 1972

[21] Appl. No.: 295,835

[52] U.S. Cl. .............. 307/304, 307/221 D, 307/303, 317/235 A, 317/235 E, 317/235 F, 317/235 G

[51] Int. Cl. .............................................. H01l 19/00

[58] Field of Search ................. 307/304; 317/235 A, 317/235 E, 235 F, 235 G

[56] References Cited

UNITED STATES PATENTS

| | | | |
|---|---|---|---|
| 3,230,428 | 1/1966 | Evans | 317/235 A |
| 3,649,386 | 3/1972 | Murphy | 317/235 F |
| 3,386,865 | 6/1968 | Doo | 317/235 F |

FOREIGN PATENTS OR APPLICATIONS

| | | | |
|---|---|---|---|
| 6,805,705 | 10/1969 | Netherlands | 317/235 G |

OTHER PUBLICATIONS

Scientific American, July 1971, page 11, "LOCOS ...," (Philips Ad.) L 7180 0002, 317–235 B, 317–235 F.

*Primary Examiner*—Rudolph V. Rolinec
*Assistant Examiner*—William D. Larkins
*Attorney*—John F. Ahern et al.

[57] ABSTRACT

Undesired coupling of JFET or MESFET bucket-brigade stages through the epitaxial layer in a monolithic integrated bucket-brigade circuit is prevented by isolating adjacent stages by strips of thick oxide dielectric material such as $SiO_2$. The dielectric strips are formed by selective oxidation to obtain local conversion of the n-type silicon epitaxial layer to $SiO_2$. In a second embodiment, elongated spaced-apart mesas of the $SiO_2$ are formed on the substrate prior to forming the patterned n-type silicon epitaxial layer. The storage capacitors of the bucket-brigade stages are MOS devices formed by metal layers overlapping the drain electrode regions of the JFETs or MESFETs diffused in the epitaxial layer with the dielectric material being a $SiO_2$ layer therebetween.

20 Claims, 11 Drawing Figures

Figure 1:
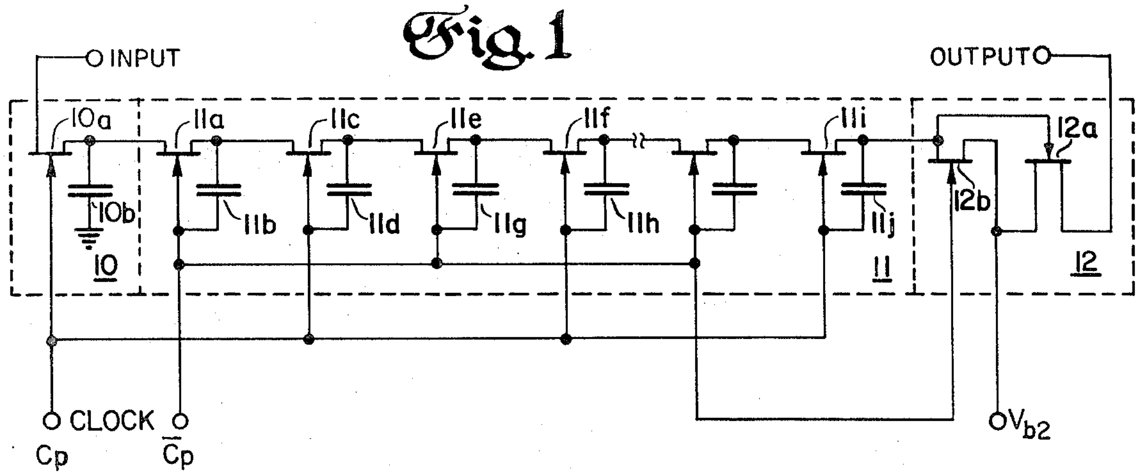

DIELECTRIC STRIP ISOLATION FOR JFET OR MESFET DEPLETION-MODE BUCKET-BRIGADE CIRCUIT

Our invention relates to a monolithic integrated analog circuit of the bucket-brigade type, and in particular, to a means for preventing undesired coupling of bucket-brigade stages in the circuit. The invention herein described was made in the course of or under a contract or subcontract thereunder with the Department of the Air Force.

The recently developed bucket-brigade circuit is currently finding use in many applications such as audio and video delay, time-error correction, time-scale conversion and filtering as some examples. The bucket-brigade circuit is variously described as a sampled-data circuit or a digitally controlled analog charge transfer circuit, but may be most simply described as an analog signal shift register. The bucket-brigade circuit thus provides a means for realizing an electronically variable delay line which has many uses in analog signal processing. The bucket-brigade circuit, herein abbreviated to BBDL for bucket-brigade delay line, may be generally described as a series array of capacitors interconnected by suitable electronic switches which, when implemented in monolithic form in the prior art, have been transistors of the bipolar or MOSFET type. Information can be stored as charged packets in such array of capacitors and is caused to be propagated through the array at a rate determined by the (clock) rate at which the switches are sequentially opened and closed. The bucket-brigade circuit, therefore, provides a non-inductive means for implementing an analog delay line, the delay period of which is controlled by an external clock, and recent advances in microelectronic technology permit implementation of the BBDL in single monolithic integrated circuit form.

The BBDL in integrated circuit form offers many advantages over a like circuit fabricated of discrete transistor and capacitor devices, the most obvious advantages being the compactness, lower power requirements and greater durability of the integrated circuit. In the case of the prior art MOSFET embodiment of the BBDL, the transistors require relatively large gating voltages and the BBDL is limited in speed (information propagation rate through the BBDL) by the small current flow capability of the MOS transistors. In the case of the prior art bipolar transistor embodiment, the integrated circuit approach requires more complex processing, has a relatively low packing density, and is further handicapped by a relatively high base-current requirement. The above-mentioned disadvantages, which may be tolerable for short length BBDLs, place a limit on the practical length of such circuits. However, these disadvantages may be overcome to a great extent by the use of JFETs (junction field effect transistors) or MESFETs (metal-silicon field effect transistors) as the electronic switches in the BBDL.

A concurrently filed application S.N. 295,872 entitled "Gate Diffusion Isolation for JFET Depletion-Mode Bucket-Brigade Circuit," inventors Mark B. Barron and Walter J. Butler, and assigned to the assignee of the present invention, is directed to a related invention wherein $p^+$ diffusions are used for isolating the bucket-brigade stages.

The JFET and MESFET devices, as used herein, are depletion-mode devices, and therefore require isolation between adjacent such devices when formed on a single substrate to prevent undesired coupling through the epitaxial layer of the charge packets which represent the information caused to be propagated through the BBDL, and a novel isolation approach is thus required if reasonable packing densities are to be obtained. Depletion-mode JFET or MESFET devices are preferred in the BBDL circuit over enhancement-mode devices since lower gating voltages of the order of 5 volts or less are used with depletion-mode devices, thereby making the circuit compatible with transistor-transistor logic ($T^2L$) circuitry and reducing the power dissipation of the devices which is proportional to the gate voltage squared. Another reason for preferring the depletion mode over the enhancement-mode devices is that their operation depends on bulk rather than surface properties. These features are of particular significance for large scale arrays of such depletion mode devices (and a BBDL of even moderate length is a large scale array) where yield and parameter uniformity are of utmost importance. Although the fabrication of JFET and MESFET devices is now a well established technology, their use in integrated circuits has been limited to circuits having a common gate control line which limitation results from the processing methods employed. In conventional JFET and MESFET processing of the common gate control line circuits, a $p^+$ diffusion isolation technique is employed, but such technique is impractical with separate gate control lines as required in BBDL circuits due to the strong interaction between substrate and gates of adjacent JFETs or MESFETs. In such conventional $p^+$ diffusion isolation, the $p^+$ top-gate diffusion region overlaps the $p^+$ isolation diffusion region whereby all of the gates are connected by the isolation diffusion to the p substrate. However, in the case of separate gate control line JFET or MESFET circuits, the required isolation excludes connection of the $p^+$ gate diffusions to the p substrate. An alternative conventional isolation technique utilizes a ring-type structure in which the transistor source is surrounded by an isolation diffusion, and the gate diffusion which surrounds the drain is kept separate from the isolation. However, the ring structure inefficiently uses the silicon area which results in large capacitances, and excess capacitance is detrimental in BBDL circuits in that it degrades both the input dynamic range and analog bandwidth thereof. In addition, there is a large drain-source feedback capacitance which causes signal dispersion in bucket-brigade circuits. Thus, JFET and MESFET BBDL integrated circuits require a new isolation method that results in small geometry structures without connection of the transistor gates to the substrate.

Therefore, one of the principal objects of our invention is to provide a new integrated BBDL circuit and method of fabrication thereof.

Another object of our invention is to fabricate the monolithic BBDL circuit utilizing JFET or MESFET devices as the switching elements in the BBDL.

A further object of our invention is to provide the BBDL circuit with improved high frequency performance.

A still further object of our invention is to provide the BBDL circuit with lower gating voltage requirements.

A local oxidation of silicon method has been used in the prior art for isolation purposes in bipolar circuits, but it is recognized that such bipolar integrated circuits are entirely distinct from the JFET and MESFET circuits. Thus, a mere knowledge of such isolation method as it applies to bipolar circuits is not sufficient for one skilled in the art to utilize such method in JFET or MESFET circuits since the structures are entirely different. Firstly, the JFET and MESFET structures described in our invention make active use of the silicon area along the oxide wall which is not done in bipolar structures. Secondly, each bipolar transistor is completely surrounded by oxide in the prior art whereas the JFET and MESFET structures utilize oxide isolation on only two sides (i.e., the sides defining the source-to-drain channels) of the transistors. Each transistor is isolated on the remaining two sides by the depleted gate regions of the preceding and succeeding transistor stages. The exceptions are at the input sampling stage, at the left and right ends of each row of bucket-brigade stages, and at the source end of the source follower output, all of which have isolation oxide on three sides of the device.

Therefore, a further object of our invention is to provide the JFET and MESFET devices and storage capacitors in the BBDL integrated circuit with an improved isolation to prevent undesired coupling through the epitaxial layer of the charge packets which are propagated through the BBDL.

Briefly summarized, and in accordance with the objects of our invention, we provide a monolithic integrated BBDL structure utilizing JFET or MESFET devices as the switching elements and a method of fabrication thereof. The structure consists of a common substrate fabricated of a lightly doped semiconductor of a first conductivity type or an electrically insulating material on which are formed one or more parallel, spaced-apart epitaxial layers of a second conductivity type semiconductor material of number equal to the number of rows of the bucket-brigade stages. Within the spacing along the two sides of each epitaxial layer is formed a thick strip of dielectric material for electrically isolating the JFET or MESFET devices and storage capacitors to be formed and thereby preventing undesired coupling through the epitaxial layer of the charge packets which are caused to be propagated through the BBDL. The strips of isolating material are formed by selective oxidation of the epitaxial layer in its unitary form along the regions to be isolated in a first fabrication approach, and by forming strips of the isolating material directly on the substrate prior to forming the one or more spaced-apart epitaxial layers which partially overlap the isolation strips in an alternative fabrication approach. A dielectric layer is then formed over the epitaxial layers and patterned and etched for the subsequent diffusions of the source-drain and gate (for the JFET embodiment) regions into the epitaxial layers. A metal layer is then deposited over the dielectric layer, and the portions of the overlapping metal layer and the drain diffused regions in the epitaxial layer form the "plates" of the bucket-brigade MOS storage capacitors with the dielectric material therebetween being the capacitor dielectric. In the case wherein the substrate material is of the $p^-$-type semiconductor, a $p^+$ diffused channel stopper is formed at each isolating strip-substrate interface to prevent surface inversion of the $p^-$ substrate to n-type semiconductor material.

Figure 2A:
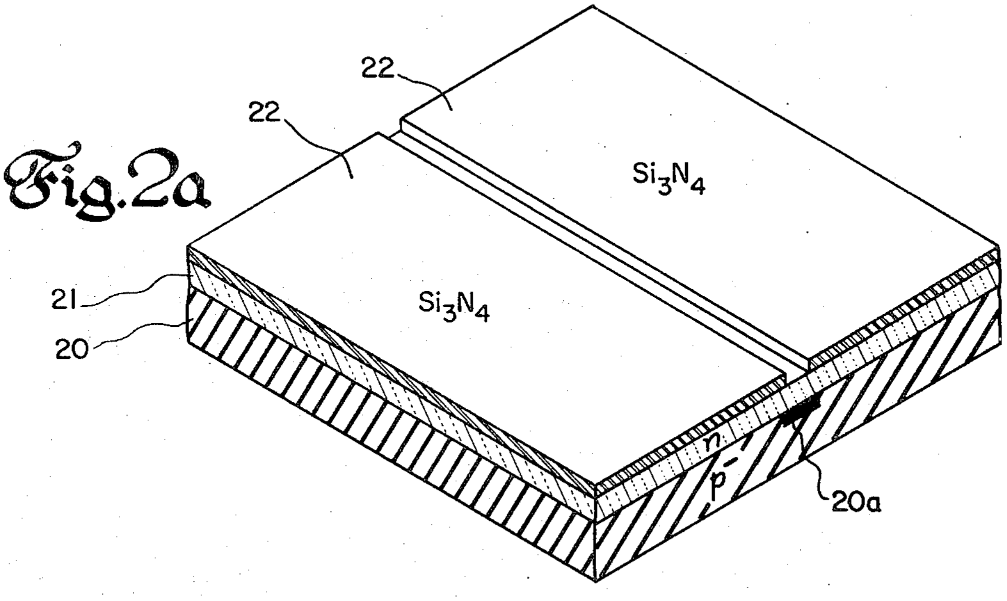
Figure 2B:
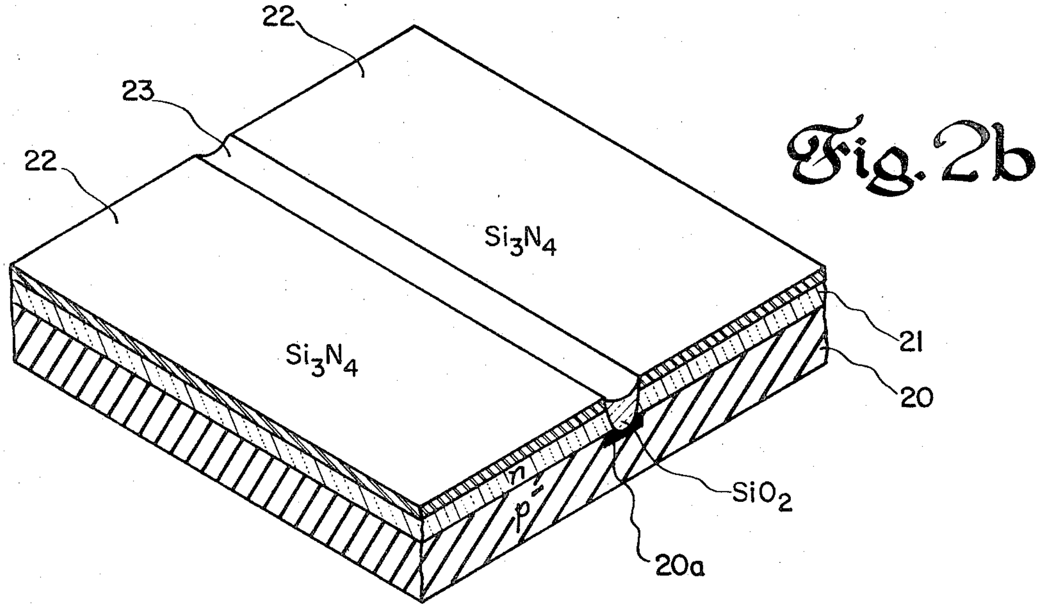
Figure 2C:
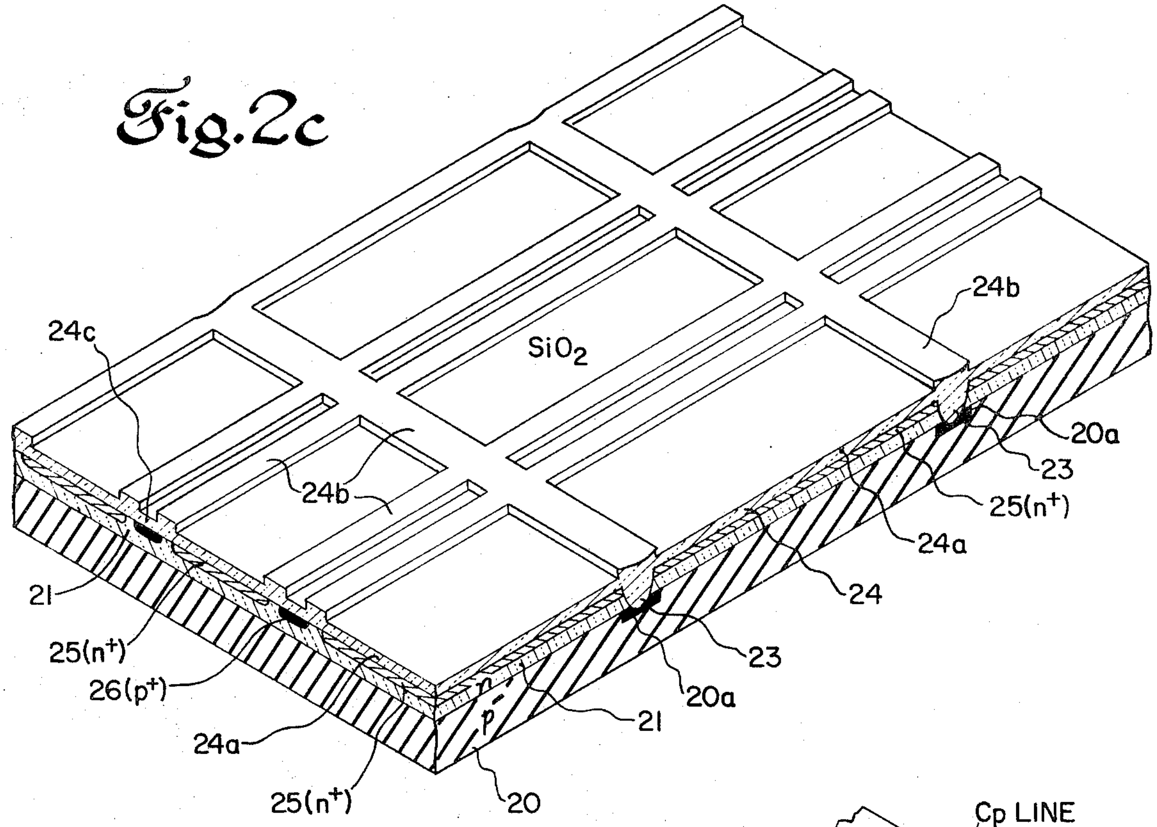
Figure 2D:
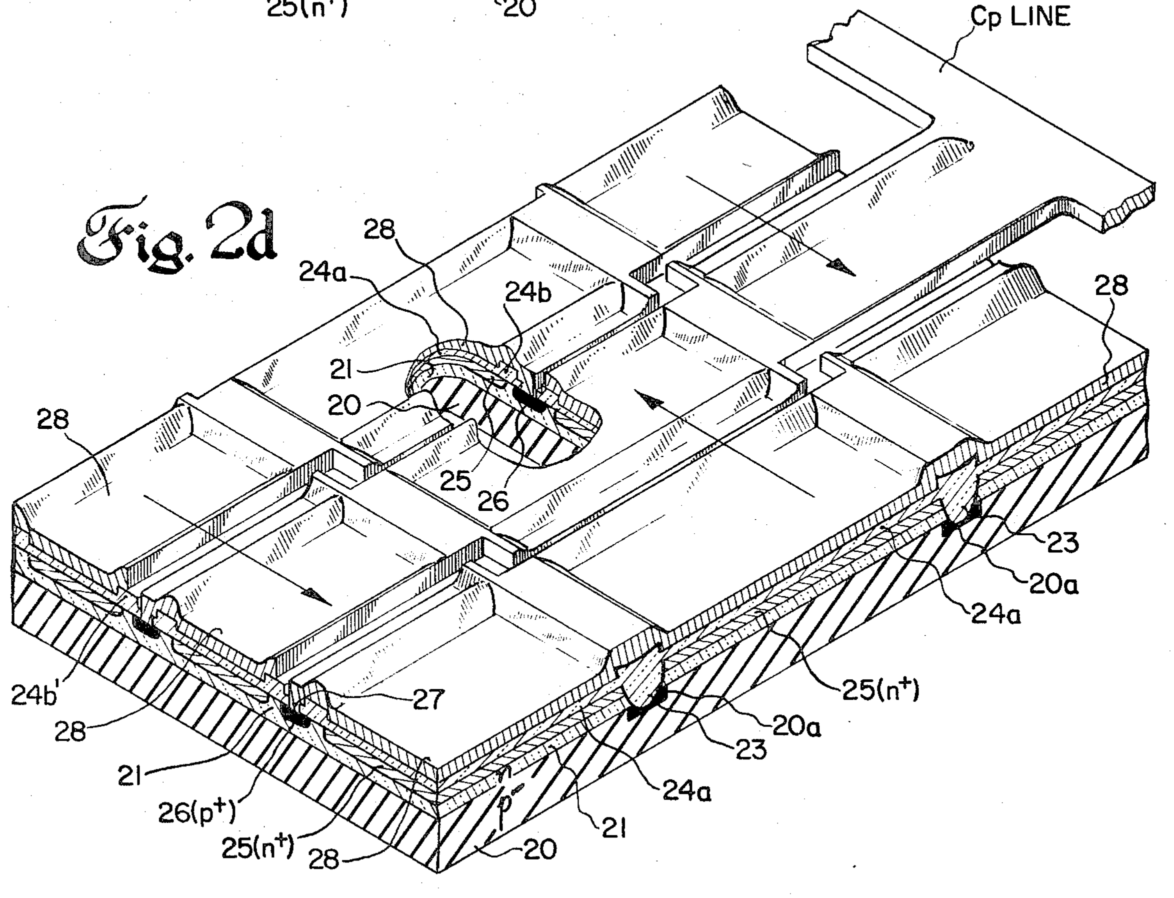

The features of our invention which we desired to protect herein are pointed out with particularity in the appended claims. The invention itself, however, both as to its organization and method of operation, together with further objects and advantages thereof, may best be understood by reference to the following description taken in connection with the accompanying drawings wherein:

FIG. 1 is a schematic representation of a bucket-brigade delay line circuit of the type fabricated in accordance with our invention in integrated circuit form utilizing JFET or MESFET devices as the switching elements in the BBDL;

FIGS. 2*a*, *b* and *c* illustrate intermediate steps in fabricating a JFET bucket brigade utilizing thick oxide isolation and shown in its completed state in FIG. 2*d;*

Figure 3A:
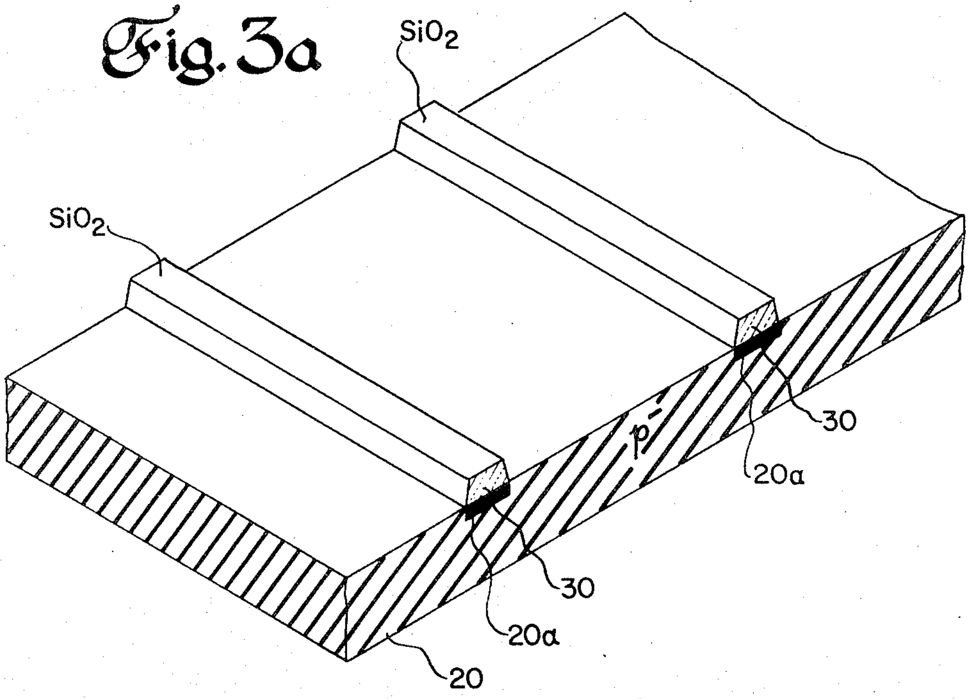
Figure 3B:
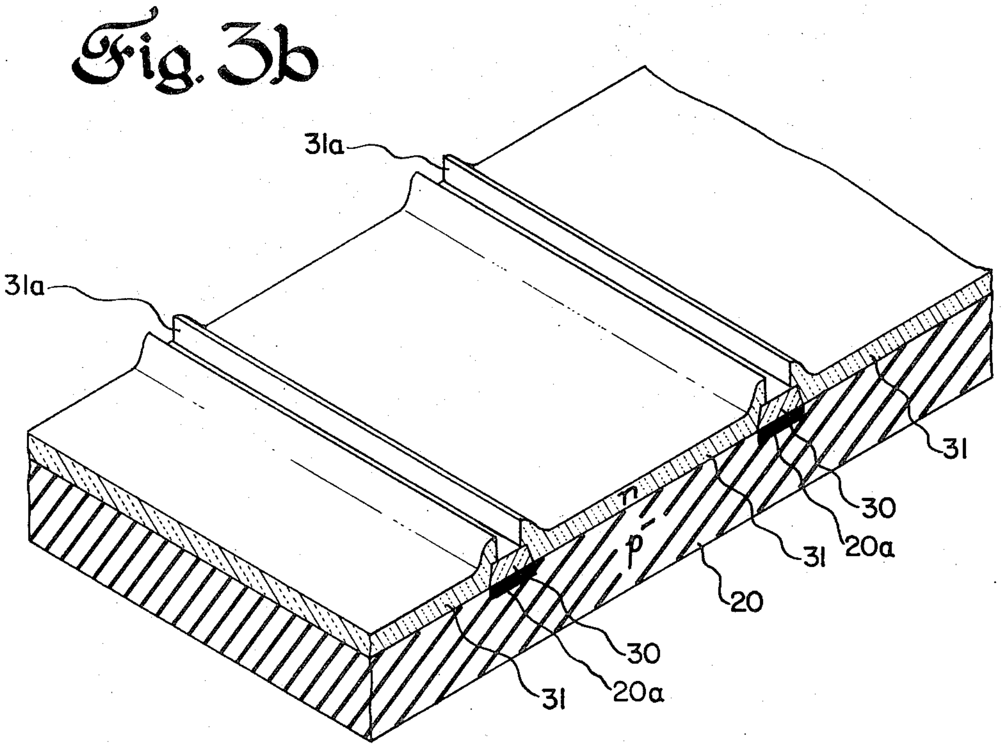
Figure 3C:
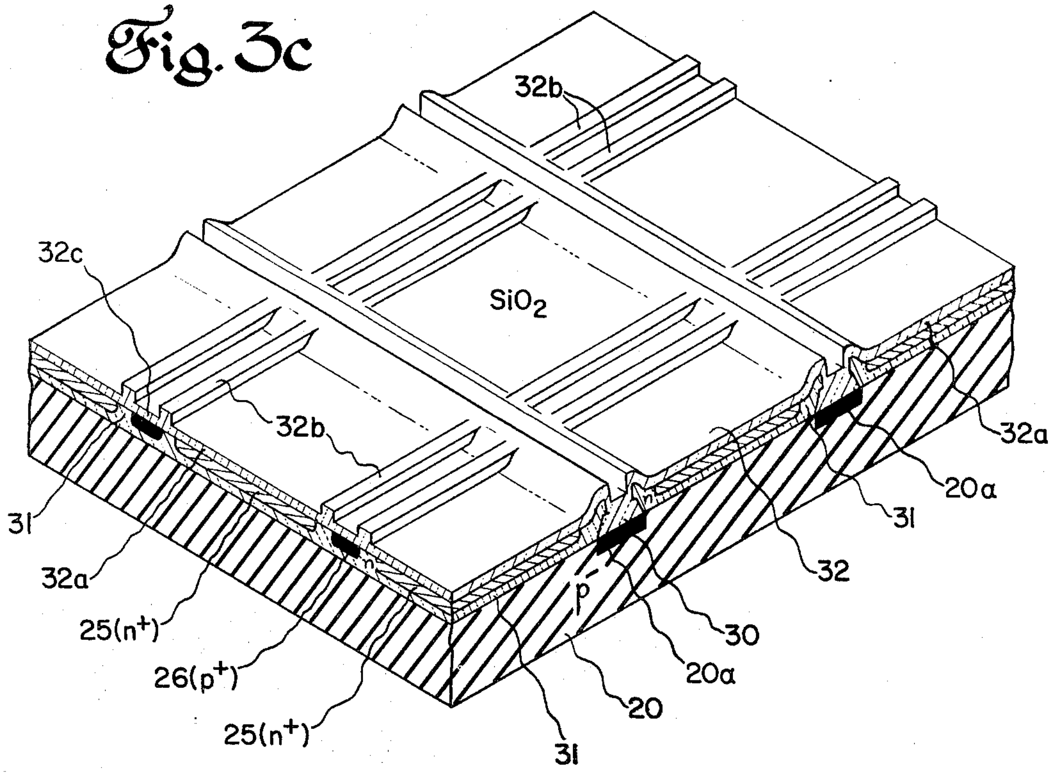
Figure 3D:
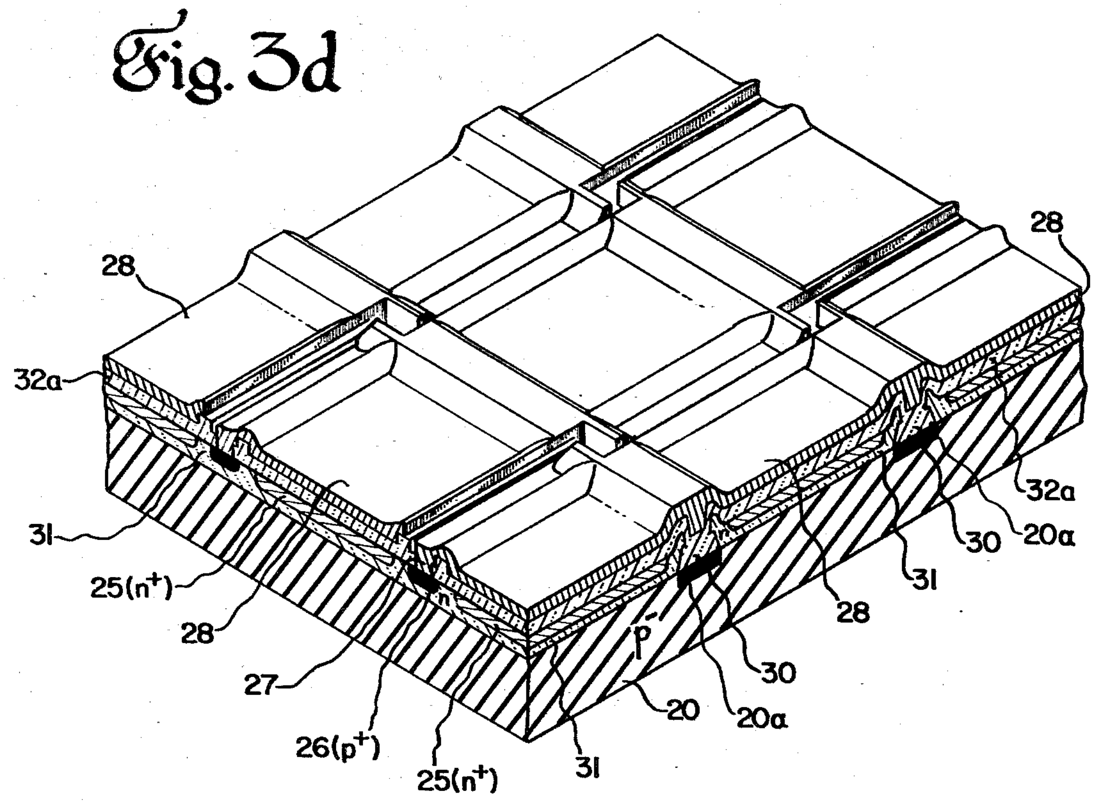

FIGS. 3*a*, *b* and *c* illustrate intermediate steps in fabricating a JFET bucket brigade utilizing selective epitaxy isolation and shown in its completed state in FIG. 3*d;*

Figure 4:
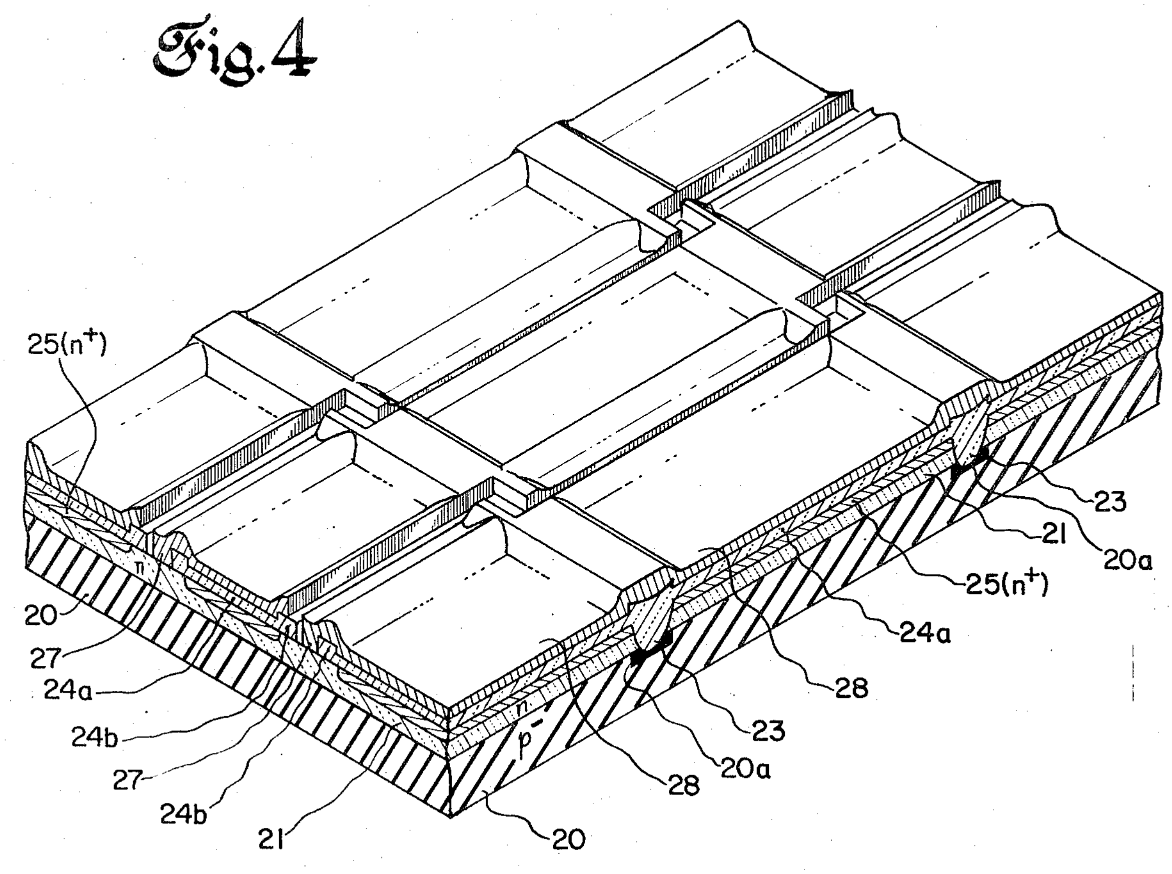
Figure 5:
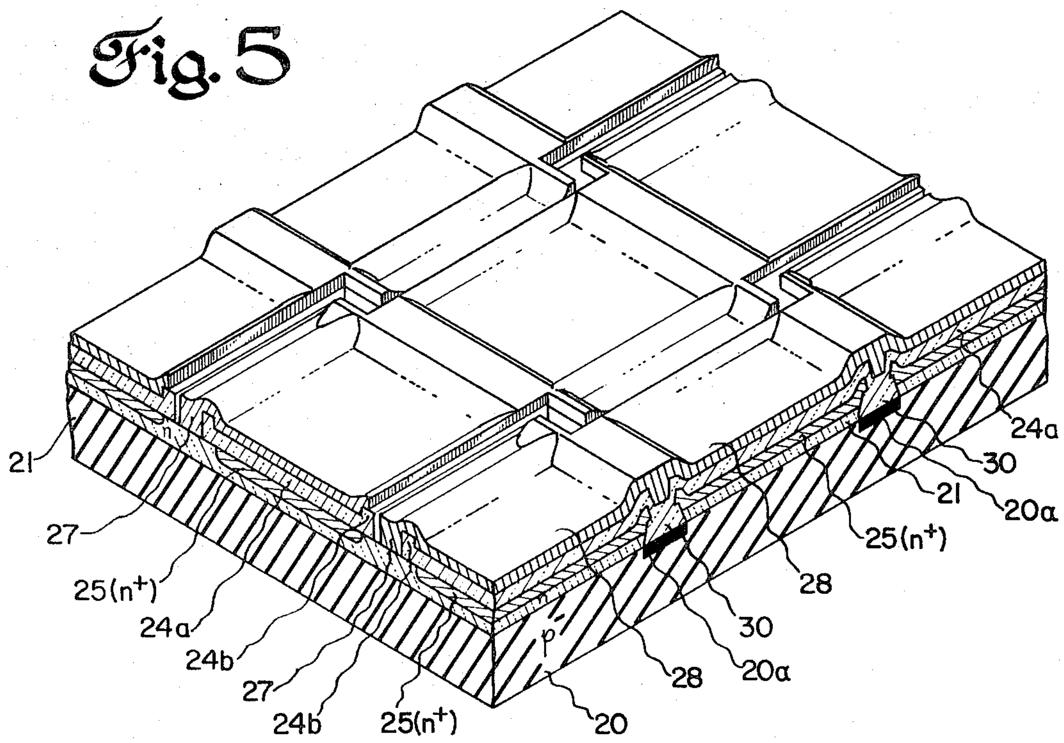

FIG. 4 illustrates the completed state of a MESFET bucket brigade utilizing thick oxide isolation; and FIG. 5 illustrates the completed state of a MESFET bucket brigade utilizing selective epitaxy isolation.

Referring now in particular to FIG. 1, there is illustrated a typical BBDL which consists of an input sampling stage 10, a plurality of delay line stages 11, and an output stage 12. The BBDL thus samples, holds and delays an input analog signal $x(t)$ by a time T which is normally an integral number of (sampling) intervals $T_s$ at which the input signal is sampled. The input sampling stage 10 of the BBDL consists of a first electronic switch 10*a*, which is a JFET or MESFET device 10*a* in our particular invention, having its source electrode connected to the input terminal of the BBDL, its gate electrode connected to a line $C_p$ supplied with square wave pulses generated by a two-phase digital clock, and its drain electrode connected to a grounded capacitor 10b and to the source electrode of a JFET or MESFET 11a in the first stage of the delay line stages 11. The input signal sampling interval $T_s$ is thus controlled by the frequency of clock pulse $C_p$.

Depending upon the type of substrate material utilized in the monolithic fabrication of the BBDL and the potential at which such substrate is maintained, the analog input signal to the BBDL may be biased with a positive or negative voltage. Thus, in the case wherein the substrate is of p-conductivity type material (as exemplified herein) and maintained at ground potential, the analog input signal is biased from a source of positive voltage for insuring that the signal applied to the input $n^+$-region forming the source electrode of input sampling transistor 10*a* is always of positive polarity. The digital clock voltage pulses $C_p$ and $\overline{C_p}$ are of negative polarity for the n-channel type transistors in the BBDL as exemplified herein.

The plurality of delay line stages 11 are formed by serially connected pairs of bucket-brigade stages. Each pair of bucket-brigade stages includes two serially connected electronic switches (JFETs or MESFETs herein) and a charge packet storage capacitor connected across the drain and gate electrodes of each transistor. It should be understood that the transistors are all either JFETs or MESFETs in each BBDL, and not combinations thereof. The gate electrode of the first transistor in each delay line stage is also connected to the complementary clock pulse line $\overline{C_p}$ whereas the gate electrode of the second transistor is also connected to clock pulse line $C_p$. Thus, capacitor 11*b* is connected across the drain and gate electrodes of transistor 11*a*, the gate electrode of transistor 11*a* is also connected to the $\overline{C}_p$ clock pulse line, and the drain electrode is connected to the source electrode of transistor 11*c* which together with capacitor 11*d* forms the second half of the first pair of bucket-brigade stages. Thus, capacitor 11*d* is connected across the drain and gate electrodes of transistor 11*c* and the gate electrode is also connected to the common clock pulse line $C_p$. The drain electrode of transistor switch 11*c* is connected to the source electrode of transistor 11*e* in the following pair of bucket-brigade stages consisting of transistors 11*e*, 11*f* and capacitors 11*g*, 11*h*. The second and all further pairs of bucket-brigade stages are serially connected in the same manner as the first stage. The number of pairs of bucket-brigade stages determines the BBDL time delay, T, for a given clock frequency.

The last bucket-brigade stage of the BBDL consists of transistor 11*i* and capacitor 11*j* connected across its drain and gate electrodes. The gate electrode of transistor 11*i* is also connected to the common $C_p$ clock pulse line, the source electrode is connected to the drain electrode of the previous bucket-brigade stage, and the drain electrode could comprise the output of the BBDL. However, for purposes of isolating the output of the BBDL, an output stage 12 is connected to the drain electrode of transistor 11*i*. The output stage 12 comprises a source-follower stage consisting of a transistor 12*a* having its gate electrode connected to the drain electrode of transistor 11*i*, its drain electrode connected to a source of direct current bias voltage $V_{b2}$ (of positive polarity when input bias is positive) and its source electrode being the output terminal of the BBDL. A transistor 12*b* having its source electrode connected to the drain electrode of transistor 11*i*, and its drain electrode connected to the source of bias voltage $V_{b2}$ and its gate electrode connected to the common complementary clock pulse line $\overline{C}_p$ is utilized as a switching device for precharging the last capacitor 11*j* in the BBDL to a full charge, that is, transistor 12*b* permits filling the last "bucket" in accordance with conventional operation of BBDLs wherein the fullness of the buckets (the capacitive storage elements) proceeds from the last stage toward the first stage and the emptiness of such buckets, which contains the information (sampled analog input signal) to be propagated through the BBDL, proceeds from the first to the last stage. Thus, transistor 12*b* functions as a switch for providing (in conjunction with bias voltage $V_{b2}$) full charge of capacitor 11*j* prior to receiving an analog signal sample. The signal information is represented by the extent to which a full bucket is emptied, that is, the signal propagation through th BBDL from the input to the output ends is effected by means of a charge deficit transfer.

In developing a BBDL for operation at high clock frequencies (in excess of 10 MHz) two problems are faced: (1) the transistor devices in the bucket brigade must be switched from one state to the other at a sufficiently high speed, and (2) the charge packet transfer between adjacent storage sites must also occur sufficiently fast. The clock generator capability determines the rate at which the transistor devices can be switched and the problem is therefore of switching the total gate-substrate capacitance through a required gate voltage. The clock generator (i.e., gate driver) requirements will obviously be much less severe, and result in better high frequency operation, if the total gate-substrate capacitance or required gate voltage can be reduced.

The rate at which charge can be transferred between adjacent storage sites in the BBDL is a function of the transistor device transconductance ($g_m$). Thus, transistors with higher $g_m$ values yield a significant improvement in high frequency performance of the BBDL circuit. The charge transfer operation is ultimately limited by the charge transfer speed of the transistor switch. In the case of MOSFET devices, the $g_m$ value is a function of the source-drain channel aspect ratio (width/length) which cannot deliberately be made large enough for very fast charge transfer. By comparison, JFET and MESFET devices have $g_m$ values five to 10 times that of comparable MOSFETs, and therefore improve the high frequency performance of the BBDL. Further, as mentioned hereinabove, the JFET and MESFET are depletion-mode devices, and therefore the lower gate voltages employed therewith reduce the severity of the clock generator requirements thereby further resulting in improved high frequency operation of the BBDL. Thus, since a BBDL fabricated of JFET or MESFET devices has lower gating voltage requirements, and such devices have higher $g_m$ values, it clearly results in significantly improved high frequency performance over the MOSFET (and also the bipolar transistor) embodiments of the BBDL. And up to the time of our invention, the difficulties encountered in fabricating BBDL circuits in integrated circuit form utilizing JFETs and MESFETs has prevented such circuits from becoming a reality.

The fabrication of our BBDL integrated circuit will now be described, and a preferred embodiment of the JFET bucket-brigade having isolation between bucket-brigade stages formed by a thick oxide isolation technique (which prevents undesired coupling of the charge packets through the epitaxial layer) will be described with specific reference to FIGS. 2*a*, *b*, *c* and *d*. The isolation is required, in order to obtain high packing densities, since the JFET and MESFET are depletion-mode devices. The structures illustrated in FIGS. 2*a*, *b* and *c* show intermediate steps in forming the final structure illustrated in FIG. 2*d*, and each figure depicts only a very small portion of the bucket-brigade array, but in a very enlarged view. It must be remembered that the serially connected pairs of bucket-brigade stages may be arranged in a single row or in juxtaposed rows on the single integrated circuit chip. The input sampling stage 10 and output stage 12 are of very similar structure to the bucket-brigade stage and therefore are also conveniently located on the same integrated circuit chip and are fabricated as continuations of the bucket-brigade stages at the input and output ends thereof, respectively.

Referring now to FIG. 2*a*, a substrate 20 of suitable monocrystalline material and size is selected. The substrate 20 material may be an electrical insulator, such as spinel or sapphire, but is preferably a lightly doped semiconductor such as $p^-$-conductivity type silicon, the light doping resulting in lower parasitic capacitances in the fabricated JFET and MESFET devices. Although our invention may be practical using other semiconductors, such as germanium, gallium arsenide, etc., for ease of description, the invention will be described as practiced in forming silicon devices. Also, although our invention may be practiced by utilizing an n-conductivity type semiconductor as the substrate material (and likewise using the opposite conductivity type semiconductor layers and diffused regions from that recited hereinafter as associated with the p-type substrate), again for ease of description our invention will be described with reference to the p-type substrate.

Substrate 20 may typically have a thickness of 10 mils and an area sufficient to accommodate a packing density of one square mil per bucket-brigade stage. The 10 mil thickness develops good handling characteristics for the substrate without undue waste of the material. Neither the thickness nor especially the area dimension recited hereinabove are a limitation on our invention but merely exemplary thereof. The $p^-$-type substrate has a resistivity greater than 5 ohm-centimeters (cm).

An n-doped monocrystalline thin layer 21 of silicon is next thermally grown along the entire major (top) surface of substrate 20 as depicted in FIG. 2*a*. This n-type epitaxial layer 21 is typically of thickness in the range of 1–3 microns and provides the layer into which the semiconductor junctions are to be diffused. The n-type epitaxial layer has a resistivity typically in the range of 0.2 to 0.8 ohm-cm. As the next step in the fabrication process, a thin film of silicon nitride ($Si_3N_4$) or other suitable electrical insulator material such as silicon oxynitride is coated along the entire top surface of the epitaxial layer 21. This film, upon being subsequently patterned and etched will serve as a mask for the formation of the isolation channels or strips along the two sides of a row of the bucket-brigade stages, and in the case of rows thereof, the isolation channels are between adjacent rows of the JFET and MESFET bucket-brigade stages in the BBDL. The thickness of the insulator film is typically in the range of 1,500 to 2,000 Angstrom. The film is then patterned and selectively etched as depicted in FIG. 2*a* to form one or a plurality (of number equal to the number of rows of bucket-brigade stages) or parallel wide strips 22 of equal dimension and spacing between adjacent strips. Each spacing between adjacent strips 22 forms the boundary for the dielectric isolation areas (strips) to be formed along the two sides of a single row or between adjacent rows of serially connected JFET or MESFET devices which may snake back and forth across the integrated circuit chip to form our BBDL. The silicon nitride film 22 may be conveniently etched with phosphoric acid at a temperature of 180° C for example.

Referring now to FIG. 2*b*, the next step in our fabrication process is the oxidation of the n-type semiconductor material in epitaxial layer 21 which is exposed along the two sides of strip 22 in the case of a single row of bucket-brigade stages and along the separation between adjacent strips 22 of the insulator material in the case of a plurality of rows. In the case of the silicon layer 21 being sufficiently thin (i.e., approximately one micron or less), it may be directly oxidized, otherwise it is first etched and then oxidized. The oxidation step may be conveniently accomplished in a steam atmosphere. Oxygen has a low diffusion rate through silicon nitride (insulator strips 22) and therefore no silicon dioxide ($SiO_2$) is grown beneath the silicon nitride, and only the exposed silicon area in epitaxial layer 21 is oxidized (i.e., converted from Si to $SiO_2$). Thus a silicon nitride masking and controlled combination of etching and oxidation result in local removal (i.e., conversion to $SiO_2$) of all the n-type epitaxial layer 21 beneath the separation regions of the insulator strips 22 to thereby form the $SiO_2$ isolation regions 23 which are also described herein as dielectric strip or thick oxide isolation. The thick oxide ($SiO_2$) strips 23 thus form on the substrate 20 isolated islands of $Si_3N_4$ superimposed on n epitaxial layers.

Although the $SiO_2$ in strips 23 ideally should have no impurities, it generally has positive ion impurities which have the effect of creating a parasitic n-type channel at the interface of the $SiO_2$ strip 23 and $p^-$ substrate 20. In order to prevent this surface inversion of the $p^-$ substrate to n-type, a thin strip 20*a* of heavily doped $p^+$-type semiconductor material, of the same type as to be utilized in the gate electrode regions, is diffused into substrate 20 along each region of isolating strip 23. The $p^+$ diffused channel stoppers 20*a* are preferably diffused into substrate 20 before the n layer 21 is formed thereon, but may be accomplished after the n layers 21 and silicon nitride strips 22 are formed by first removing the *n* epitaxial layer 21 in the regions of spacing between strips 22, then diffusing the $p^+$ channel stoppers 20*a* into substrate 20 and finally depositing $SiO_2$ in isolation regions 23 above and in contact with the channel stoppers. In the case wherein substrate 20 is formed of n-type semiconductor or insulating material, no channel stoppers are required.

Referring now to FIG. 2*c*, the silicon nitride mask consisting of strips 22 (in FIG. 2*b*) is next removed by selective etching thereof. After all of the $Si_3N_4$ has been removed, a layer 24 of $SiO_2$ is thermally grown along the entire top surfaces of isolating regions 23 and the strips of the n-type epitaxial layer 21 which are now isolated from each other by the deep oxidation (thick oxide) regions 23. The $SiO_2$ layer 24 is then patterned and etched for the source-drain windows and then again for the gate windows (or vice-versa) leaving only the thick portions 24*b* of the $SiO_2$ layer. The heavily doped $n^+$ source-drain regions are diffused following etching of the patterned area using a liquid, gaseous or solid diffusion source such as for examples $POCl_3$, $P_2O_5$ or $PH_3$ at a temperature which may as an example be 950° C. Additional $SiO_2$ in the form of thin portions 24*a* is grown over the monolithic chip by oxidizing the silicon of epitaxial layer 21 along the source-drain windows in an oxygen atmosphere at a temperature such as 950° C for example. Following the patterning and etching of the gate windows, the heavily-doped $p^+$ diffusions may be done using a liquid, gaseous, or solid diffusion source such as $BBr_3$, $B_2H_6$, or $B_2O_3$ for example. The diffusion temperature will vary with the thickness and resistivity of the n-type epitaxial layer but a temperature of 950° C is an example for 2 micron thickness, 0.4 ohm-cm resistivity epitaxy. Additional $SiO_2$ in the form of thin portions 24*c* is then grown over the chip by oxidizing the silicon of epitaxial layer 21 along the gate windows in an oxygen atmosphere at 950° C.

Referring now to FIG. 2*d*, the next step involves the forming of aligned contact holes 27 through the thin portions 24*c* of the $SiO_2$ layer 24 over the aligned $p^+$ gate diffused regions 26. The aligned holes 27 are of rectangular shape and are somewhat smaller than the rectangular portion of the thin layer 24*c* through which they are formed. The holes 27 are formed by pattern and etching similar to the steps used in forming the diffusion windows. After the rectangular holes 27 are formed through the $SiO_2$ layer 24, a metal layer is deposited over the entire top surface of electrically insulating $SiO_2$ layer 24. The metal may be aluminum as one example, and fills the gate region contact holes 27 to provide direct contact with the top surface of the $p^+$ diffused gate regions 26. The metal layer is then patterned and etched to form the array of spaced apart metal layers 28 depicted in FIG. 2d. The number of metal layers 28, excluding those required for the input 10 and output 12 stages is normally equal to the number of columns of bucket-brigade stages in the BBDL.

At this point it should be noted that the information is propagated through adjacent rows of bucket-brigades preferably in alternate directions as shown by the arrows in order to minimize interconnections at the ends of the intermediate rows. The completed structure of the bucket-brigade stages in FIG. 2*d* (and 3*d*, 4 and 5) requires that the information be stored as charged packets in the drain-to-gate capacitors to be described hereinafter, and such charged packets be caused to propagate from left-to-right in the illustrated alternate first and third rows, and from right-to-left in the second row. Thus, the JFET devices in the first and third rows (and other alternate rows not shown) each have their source electrode being the extreme right end portion of the $n^+$ region 25 immediately to the left of each $p^+$ gate region whereas the drain electrode is all but the extreme right end portion of the $n^+$ region 25 immediately to the right of such gate region. This relative orientation of the source and drain electrodes is obviously reversed in the second row (and other alternate rows not shown) in order to obtain the reversed direction of information flow through these rows of bucket-brigade stages. In order to obtain the above-described orientation of the JFET devices, the resulting pattern of the metal layers 28 is as follows: In the first and third rows, each metal layer 28 overlaps the entire $n^+$ doped region 25 and has its left side (as seen in FIG. 2*d*) terminate beyond the contact hole 27, i.e., on the thin portion 24*c* of the $SiO_2$ layer between the adjacent thicker portion 24*b*' and contact hole 27. The right (i.e., opposite) side of each of the metal layers in the first and third rows terminates approximately midway along the next thicker portion 24*b*' of the $SiO_2$ layer encountered after passing from left-to-right over the $n^+$ doped region 25. In the second row, the left and right sides of the metal layers 28 are displaced slightly to the right with respect to such metal layer sides in the first and third rows in order to achieve the desired above-described reversed structure of the JFETs therein. Thus, the left side of each of the metal layers 28 in the second row terminates approximately midway along the thicker portion 24*b* of the $SiO_2$ layer immediately to the right of a $p^+$ gate region 26 and the metal layer extends to the right, overlapping the entire $n^+$ doped region 25 and having its right side terminating beyond the contact hole 27, i.e., on the thin portion 24*c* of the $SiO_2$ layer between contact hole 27 and the next adjacent thicker portion 24*b*' of the $SiO_2$ layer.

Although some of the fabrication steps have been described hereinabove with some detail, it is to be understood that each individual processing step is, in itself, a conventional technique and for purposes of brevity some of the fabrication details have been omitted. As noted hereinabove, the metal layers 28 also extend in spaced-apart relationship over the intervening isolating regions 23 in the various columns of bucket-brigade stages. However, in order to achieve the above-described reverse orientation of the JFET devices in adjacent rows, the left and right sides of the metal layers 28 are displaced slightly to the right in their passage over isolating region 23 from the first row to the second row. In like manner, such sides are displaced slightly to the left in their passage over isolating region 23 from the second row to the third row to achieve alignment with the sides in the first row. The orientation of the various layers in the second row is shown clearly in the cut-away sectional view therein.

Alternatively, the metal layers may be arranged without any displacements in passage over the isolation regions, in which case the $p^+$ gate diffused regions are not aligned column-by-column, and are displaced in the opposite direction from the metal layer displacements in the second row (and other alternate rows not shown).

The top surfaces of metal layers 28 generally conform to the top surface of the $SiO_2$ layer 24 and thus result in projections (or more accurately, mesas) along the isolating regions 23 as well as along the other thick layer portions 24*b* of layer 24, as shown in FIG. 2*d*. Since the same phase clock signal is applied to each JFET device in alternate columns thereof, the same first ends of first alternate metal layers 28 are extended outward to a common clock line buss which may be designated the $C_p$ line, and the opposite second ends of the second alternate metal layers 28 are extended outward (not shown) to the common clock line buss $\overline{C}_p$. The gate-to-drain storage capacitor associated with each JFET is determined by the orientation of the $n^+$ diffused region 25 relative to the overlapping portion of the metal layer 28 which is connected to the $p^+$ diffused gate region 26. The $SiO_2$ material between the two "plates" of each resultant MOS type storage capacitor serves as the dielectric material of the capacitor. Reference to FIG. 2*d* indicates that each $n^+$ diffused region is overlapped by the metal layer by a relatively large amount, and therefore a high gate-to-drain (charge packet) storage site capacitance is desirably obtained relative to the undesirable parasitic gate-source and drain-substrate capacitances.

As a typical example of the packing density, and not by way of limitation, each monolithic chip of dimension $100 \times 100$ mil may include 4 BBDL circuits each consisting of 500 bucket-brigade stages. Since each BBDL circuit may include several isolated rows of serially connected JFET devices and storage capacitors, the first and second ends of each row of such devices, except the first and last rows, are repsectively suitably connected to the adjacent ends of the immediately prior and subsequent row to thereby obtain the back and forth snake pattern of serially connected devices across the chip.

Finally, reference to FIG. 1 indicates the similarity of the input sampling stage 10 to a bucket-brigade stage. In view of such similarity, it is readily apparent that the input sampling stage is fabricated at the input end of the BBDL in a manner similar to a single bucket-brigade stage except that the gate electrode of sampling transistor 10*a* and capacitor 10*b* have separate metallization, the metallization of the capacitor being connected to ground.

The output source-follower stage 12*a* is an optional output device of the voltage-sensing type. A current-sensing technique might also be used by monitoring the charge supplied by bias supply $V_{b2}$ during each precharge operation.

Referring now to FIGS. 3*a*, *b*, *c* and *d*, there is shown a second embodiment for fabricating a JFET BBDL integrated circuit which in this particular case utilizes a selective epitaxy isolation along the two sides of a single row or between adjacent rows of the serially connected JFET devices. Many of the steps in the selective epitaxy isolation BBDL fabrication process are the same as in the thick oxide isolation process of FIGS. 2*a–d*, and therefore only the distinguishing steps will be emphasized.

Referring now to FIG. 3*a*, a substrate 20 of an insulator material or lightly doped semiconductor material such as $p^-$-type silicon is selected, and has the same characteristics as described with respect to FIG. 2*a*. A thick layer of $SiO_2$ is then thermally grown along the entire major (top) surface of substrate 20 and is then patterned and etched as depicted in FIG. 3a to form a plurality of parallel narrow strips 30 of $SiO_2$ of equal dimension and spacing between adjacent strips. A $p^+$ diffused channel stopper 20a is generally formed in substrate 20 beneath each $SiO_2$ strip 30 prior to their formation and at their interface with substrate 20, in the manner described with reference to FIG. 2*a*. The strips 30 are oriented in the same horizontal positions as the $SiO_2$ isolation regions 23 in FIG. 2b and will serve the same purpose, that of isolating JFET-capacitor bucket-brigade stages from each other.

Referring now to FIG. 3*b*, an n-type epitaxial layer is thermally grown over the entire top surface of substrate 20 and over the isolating strips 30 of $SiO_2$. The n-type epitaxial layer is then patterned and etched as depicted in FIG. 3*b* to remove any n-type epitaxy material along the center portions of the top surfaces of the isolating strips (mesas) 30. The resulting structure is therefore a plurality (or only one in the case of a single row of bucket-brigade stages) of spaced apart, parallel oriented n-type epitaxial layers 31 of number equal to the number of rows of bucket-brigade stages to be fabricated, each layer having opposing ends 31a terminating on adjacent isolating strips 30 of $SiO_2$.

Referring now to FIG. 3c, a uniform layer 32 of $SiO_2$ is thermally grown along the entire top surfaces of the n-type epitaxial layers 31 which are now isolated from each other, and along the exposed top surfaces of isolating means 30. The $SiO_2$ layer 32 is then twice patterned and etched similarly to the pattern and etch steps in FIG. 2*c* for the source-drain and the gate windows, leaving only the thick portions 32*b* of the $SiO_2$ layer. In similar manner, the heavily-doped $n^+$ source-drain regions are then diffused into the epitaxial layers 21, the thin portions 32a of $SiO_2$ are additionally grown by oxidizing the silicon of layers 21 along the source-drain windows, the heavily-doped $p^+$ gate regions are diffused into the epitaxial layers, and finally, the thin portions 32c of $SiO_2$ are additionally grown along the gate windows.

Referring now to FIG. 3*d*, aligned contact holes 27 are next formed through the thin portions 32*c* of the $SiO_2$ layer 32 over the aligned $p^+$ gate diffused regions 26 in the manner described with reference to FIG. 2d. Finally, a metal layer is deposited over $SiO_2$ layer 32 and provides direct contact with the $p^+$ diffused gate regions 26. The metal layer is then patterned and etched to form the array of spaced apart metal layers 28 depicted in FIG. 3*d*, in a manner as described with reference to FIG. 2*d*. As described with reference to the thick oxide strip isolated BBDL, the metal layers 28 in the FIG. 3d embodiment may alternatively be arranged without any displacements in passage over the isolation regions 30 in which case the $p^+$ gate diffused regions are then displaced in the opposite direction (from the prior metal layer displacements) in the second row of the bucket-brigade stages. The metal layers 28 may be connected to the common clock line busses $C_p$ and $\overline{C}_p$, and the input sampling stage and output-stage fabricated, in the same manner as described with reference to the thick oxide strip isolated BBDL. The BBDL resulting from the fabricating steps described with reference to FIG. 3*a–d* is described herein as having bucket-brigade stages isolated from each other by a selective epitaxy technique due to the epitaxial regions being isolated by the original $SiO_2$ mesas 30.

It is obvious by reference to the completed states of the bucket-brigade stages, as illustrated in FIGS. 2d and 3*d*, that the thick oxide isolation (obtained by local oxidation of silicon) and selective epitaxy isolation techniques result in very similar structures of the BBDL, the only difference being in the isolating strips along the two sides of a single row or between adjacent rows of bucket-brigade stages. The BBDL structure thus consists of a common, lightly doped p-type or insulating substrate, a plurality of isolated coplanar (and more or less coplanar for the selective epitaxy isolation embodiment) n-type epitaxial layers equal in number to the number of rows of bucket-brigade stages, heavily doped $n^+$ drain-source and $p^+$ gate regions diffused within the epitaxial layers, and a dielectric ($SiO_2$ in our illustrated example) layer which electrically isolates spaced-apart metal layers from the $n^+$ diffused regions and thereby also serves as the dielectric of the bucket-brigade storage capacitors. The metal layers are of number equal to the number of columns of bucket-brigade stages (excluding the input 10 and output 12 stages) in the BBDL, and adjacent metal layers are spaced apart and the metal fills contact holes in the dielectric layer to provide connections from the clock line busses to the $p^+$ diffused gate regions. Since the $n^+$ diffused source-drain and $p^+$ diffused gate regions extend to the isolating strips, the charge transfer *n* channel between adjacent serially connected JFET devices is defined (in width) by the adjacent isolating strips and therefore no undesired coupling can occur through the epitaxial layer. That is, the isolating strips 23 (FIG. 2d) and 30 (FIG. 3*d*) define the two side boundaries of the series coupled source-to-drain transistor channels and capacitor storage sites and thereby limit the transfer of the electric charge packets betwen adjacent capacitor storage sites to such defined source-to-drain channels and prevent undesired coupling of charge packets at any time (i.e., during the charge transfer intervals as well as during the temporary charge storage intervals).

Referring now to FIGS. 4 and 5, there are shown the MESFET embodiments of our BBDL corresponding to the thick oxide and selective epitaxy isolation JFET BBDLs illustrated in FIGS. 2*d* and 3*d*, respectively. Thus, FIG. 4 illustrates thick oxide isolated rows of MESFET bucket-brigade stages whereas FIG. 5 illustrates selective epitaxy isolated rows of MESFET bucket-brigade stages. It can be seen that the only structural distinction between the JFET and MESFET bucket-brigades is that the JFET utilizes a p-n junction for the gate whereas the MESFET utilizes a metal-silicon junction. Thus, the contact holes 27 in the MESFET bucket-brigades are made of width equal to the width of thin layer portions 24c of the $SiO_2$ layer such that the metal of layer 28 contacts the top surface of the n-epitaxial silicon layer along an area substantially equal to the horizontal cross-sectional area of the $p^+$ diffused region in the JFET bucket-brigades. The ultimate performance of a MESFET structure depends strongly on the metal-silicon leakage current, and an overlapping of the metal gate on the thermally grown $SiO_2$ (which also serves as the dielectric for the storage capacitor) results in a substantial reduction of the leakage current to a level in the order of 50 pA/mil². In the case of a JFET structure, the leakage current is at least an order of magnitude smaller than for a MESFET. The primary advantages of the MESFET over the JFET structure are (1) the gate-source parasitic capacitance is smaller since the MESFET structure is self-aligning whereas the JFET has some lateral gate diffusion and (2) the MESFET structure requires fewer processing steps since only one ($n^+$) diffusion is required.

It is apparent from the foregoing that our invention attains the objectives set forth in that it provides a new monolithic integrated BBDL circuit utilizing JFET or MESFET bucket-brigades and the method of fabrication thereof. Since the JFET and MESFET devices as used herein are depletion-mode structures, lower gating voltages (5 volts or less) are utilized than those with enhancement-mode MOSFET or bipolar structures and thereby make our BBDL circuits compatible with $T^2L$ circuitry. The higher transconductance values obtainable with JFET and MESFET structures as compared to the MOSFET results in substantially improved high frequency performance of our bucket-brigade circuits. As an example, for the same dimensioned structures, the JFET or MESFET embodiments require 0.4 nanosecond to transfer the first 50 percent of the stored charge whereas the n-channel MOSFET requires 4.0 nanoseconds. Both the JFET and MESFET devices have drain-substrate parasitic capacitance values which are less than one third of those obtained on MOS devices. Also, both the JFET and MESFET devices have gate-substrate parasitic capacitance values which are approximately four times smaller than for the MOSFET device to thereby improve the clock generator (gate-driver) stage capability which determines the rate at which the devices can be switched. The gate-driver requirements are much less severe, and better high frequency operation results, if the total (parasitic) gate capacitance and, or the required gate voltage can be reduced, and both are reduced as stated hereinabove for the JFET and MESFET devices. The use of dielectric isolation instead of the conventional $p^+$ isolation for isolating bucket-brigade stages permits increased packing density and also minimizes side wall capacitance. As an example of the operation that can be expected with our JFET or MESFET BBDL, the bandwidth thereof is sufficiently wide such that a 10MHz clock signal with the gating voltage as low as 2 volts is a typical application Thus, our JFET or MESFET bucket-brigade circuits combine many of the advantages of the bipolar and MOSFET versions without their disadvantages. In particular, the high packing density, simple processing and good low-frequency performance of the MOSFET switch are obtained whereas the high-frequency performance, good stability and low-clocking-voltage requirement of the bipolar structure is also achieved.

Having described four embodiments of our BBDL integrated circuit, it is believed obvious that other conventional steps than those recited hereinabove may be utilized in the fabrication process to achieve the specific layers in our structure. It is, therefore, to be understood that changes may be made in the fabrication process which are within the full intended scope of the invention as defined by the follwing claims.

What we claim as new and desire to secure by letters patent of the United States is:

1. A monolithic integrated circuit of the bucket-brigade type utilizing depletion-mode field-effect transistors of the reverse-biased junction gate type and comprising a common substrate fabricated of an electrically insulating or lightly doped semiconductor material of a first conductivity type, an epitaxial layer of a semiconductor material of a second conductivity type opposite of the first type and formed over a major surface of said substrate and in contact therewith, a plurality of spaced-apart heavily doped first semiconductor regions of the second conductivity type diffused in the epitaxial layer, said first doped regions forming the source and drain electrodes of adjacent depletion-mode type field effect transistors coupled longitudinally in series circuit relationship through the epitaxial layer due to the first doped regions forming both the drain electrodes of individual transistors and the source electrodes of the next successively coupled transistors, a thin dielectric layer formed over said epitaxial layer and in contact therewith and provided with holes therethrough aligned with gate electrode regions located in the epitaxial layer between the source and drain electrodes of each transistor, the gate electrode regions being isolated from said substrate and from each other, a plurality of narrowly spaced-apart metal layers formed over said dielectric layer and in contact therewith and adapted for connection of successive metal layers to alternate outputs of a two-phase digital clock generator, said metal layers each having a relatively large surface area compared to the narrow spacing area between adjacent metal layers, said metal layers having first end portions in contact with the gate electrode regions through the holes provided in said dielectric layer, said metal layers overlapping the drain electrode portions of the first doped regions and separated therefrom by said dielectric layer to form therewith metal-oxide-semiconductor (MOS) capacitors connected between the drain and gate electrodes of the transistors and thereby forming in combination with the transistors a single row of a plurality of serially connected bucket-brigade stages in monolithic integrated circuit form, the capacitors providing temporary storage sites for electric charge packets representing information that is caused to propagate through the bucket-brigade circuit by charge transfer through the serially coupled source-to-drain transistor channels of the bucket-brigade stages in response to the transistors being alternately and successively rendered conducting and nonconducting as a result of the application of two-phase clock pulses from the outputs of the digital clock, and dielectric means disposed only along two opposite sides of said epitaxial layer and in contact with the major surface of said substrate for defining the two side boundaries of the series coupled source-to-drain transistor channels and capacitor storage sites so as to allow the transfer of electric charge packets between adjacent capacitor storage sites to occur across the entire width of the defined source-to-drain channels and preventing any undesired coupling of the charge packets at any time, the gate electrode regions extending the entire width defined by said dielectric means so as to substantially increase the transconductance of the transistor devices and also to substantially increase the packing density for a given area of the substrate as compared to conventional diffusion isolation or ring structure isolation of JFET or MESFET devices.

2. The monolithic integrated bucket-brigade circuit set forth in claim 1 wherein said common substrate comprises a $p^-$ conductivity type semiconductor material, said epitaxial layer comprises an n conductivity type semiconductor material, and said heavily doped first semiconductor regions comprise an $n^+$ conductivity type semiconductor material.

3. The monolithic integrated bucket-brigade circuit set forth in claim 1 wherein a plurality of spaced-apart heavily doped second semiconductor regions of the first conductivity type diffused in the epitaxial layer in the source-to-drain channels to form the gate electrode regions therein whereby the transistors are of the JFET type, the plurality of heavily doped second semiconductor regions being one less than the plurality of the heavily doped first semiconductor regions.

4. The monolithic integrated bucket-brigade circuit set forth in claim 1 wherein the gate electrode regions are the portions of the epitaxial layer in the source-to-drain channels overlapped by the holes provided through said dielectric layer whereby the transistors are of the MESFET type.

5. The monolithic integrated bucket-brigade circuit set forth in claim 1 wherein said dielectric means are strips of a dielectric material formed over the major surface of said common substrate and disposed along and in contact with the sides of the source-to-drain transistor channels and capacitor storage sites.

6. The monolithic integrated bucket-brigade circuit wet forth in claim 5 wherein said metal layers also overlap said dielectric strips and are in contact therewith, said dielectric strips oriented substantially perpendicular to said metal layers.

7. The monolithic integrated bucket-brigade circuit set forth in claim wherein said dielectric means are oxidized portions of said epitaxial layer in the regions along and in contact with the sides of the source-to-drain transistor channels and capacitor storage sites.

8. The monolithic integrated bucket-brigade circuit set forth in claim 7 wherein said dielectric layer also overlaps the oxidized portions of said epitaxial layer, the oxidized portions of said epitaxial layer oriented substantially perpendicular to said metal layers.

9. The monolithic integrated bucket brigade circuit set forth in claim 2 and further comprising a $p^+$ diffused channel stopper formed at the two interfaces of said dielectric means and said substrate for preventing inversion of the $p^-$-type substrate material to the n-type.

10. A monolithic integrated circuit of the bucket-brigade type uitilizing depletion-mode field-effect transistors of the reverse-biased junction gate type and comprising a common substrate fabricated of an electrically insulating or lightly doped semiconductor material of a first conductivity type, a plurality of spaced-apart parallel oriented epitaxial layers of a semiconductor material of a second conductivity type opposite of the first type and formed over a major surface of said substrate and in contact therewith, a plurality of spaced-apart heavily doped first semiconductor regions of the second conductivity type diffused in the epitaxial layers and arranged in a single row in each epitaxial layer, said first doped regions forming the source and drain electrodes of adjacent depletion-mode type field effect transistors coupled longitudinally in series circuit relationship in each row thereof through the common epitaxial layer due to the first doped regions forming both the drain electrodes of individual transistors and the source electrodes of the next successively coupled transistors, a thin dielectric layer formed over said epitaxial layers and in contact therewith and provided with holes therethrough aligned with gate electrode regions located in the epitaxial layers between the source and drain electrodes of each transistor, the gate electrode regions being isolated from said substrate and from each other, a plurality of narrowly spaced-apart parallel metal layers formed over said dielectric layer and in contact therewith and adapted for connection of successive metal layers to alternate outputs of a two-phase digital clock generator, said metal layers each having a relatively large surface area compared to the narrow spacing area between adjacent metal layers, said metal layers oriented substantially perpendicular to said epitaxial layers and having first end portions in contact with the gate electrode regions through the holes provided in said dielectric layer, said metal layers overlapping the drain electrode portions of the first doped regions and separated therefrom by said dielectric layer to form therewith metal-oxide-semiconductor (MOS) capacitors connected between the drain and gate electrodes of the transistors and thereby forming in combination with the transistors a plurality of rows and columns of bucket-brigade stages in monolithic integrated circuit form, the bucket-brigade stages being serially connected in each row and the number of rows being equal to the plurality of epitaxial layers, the number of columns being equal to the plurality of metal layers, the capacitors providing temporary storage sites for electric charge packets representing information that is caused to propagate through the bucket-brigade circuit by charge transfer through the serially coupled source-to-drain transistor channels of the bucket-brigade stages in response to the transistors being alternately and successively rendered conducting and nonconducting as a result of the application of two-phase clock pulses from the outputs of the digital clock, and dielectric means disposed only along two opposite sides of each said epitaxial layer and in contact with said substrate for defining the two side boundaries of the series coupled source-to-drain transistor channels and capacitor storage sites so as to allow the transfer of electric charge packets between adjacent capacitor storage sites to occur across the entire width of the defined source-to-drain channels and preventing any undesired coupling of the charge packets at any time, the gate electrode regions extending the entire width defined by said dielectric means so as to substantially increase the transconductance of the transistor devices, and also to substantially increase the packing density for a given area of the substrate as compared to conventional diffusion isolation or ring structure isolation of JFET or MESFET devices.

11. The monolithic integrated bucket-brigade circuit set forth in claim 10 wherein said common substrate comprises a $p^-$ conductivity type semiconductor material, said epitaxial layers comprise an n conductivity type semiconductor material, and said heavily doped first semiconductor regions comprise an $n^+$ conductivity type semiconductor material.

12. The monolithic integrated bucket-brigade circuit set forth in claim 10 wherein a plurality of spaced-apart heavily doped second semiconductor regions of the first conductivity type diffused in the epitaxial layers in the source-to-drain channels to form the gate electrode regions therein whereby the transistors are of the JFET type, the plurality of heavily doped second semiconductor regions being one less than the plurality of the heavily doped first semiconductor regions.

13. The monolithic integrated bucket-brigade circuit set forth in claim 10 wherein the gate electrode regions are the portions of the epitaxial layers in the source-to-drain channels overlapped by the holes provided through said dielectric layer whereby the transistors are of the MESFET type.

14. The monolithic integrated bucket-brigade circuit set forth in claim 10 wherein said dielectric means are a plurality of parallel strips of a dielectric material formed over the major surface of said common substrate and disposed along and in contact with the sides of the source-to-drain transistor channels and capacitor storage sites and providing the spacing between adjacent epitaxial layers.

15. The monolithic integrated bucket-brigade circuit set forth in claim 14 wherein said metal layers also overlap said dielectric strips and are in contact therewith, said dielectric strips oriented substantially perpendicular to said metallized layers.

16. The monolithic integrated bucket-brigade circuit set forth in claim 10 wherein said dielectric means are a plurality of parallel oxidized portions of said epitaxial layers in the regions along and in contact with the sides of the source-to-drain transistor channels and capacitor storage sites and providing the spacing between adjacent epitaxial layers.

17. The monolithic integrated bucket-brigade circuit set forth in claim 16 wherein said dielectric layer also overlaps the oxidized portions of said epitaxial layers, the oxidized portions of said epitaxial layers oriented substantially perpendicular to said metal layers.

18. The monolithic integrated bucket-brigade circuit set forth in claim 11 wherein the substrate semiconductor material is silicon, the epitaxial layer material is silicon, and the dielectric layer material is silicon dioxide.

19. The monolithic integrated bucket-brigade circuit set forth in claim 18 wherein the metal layer material is aluminum.

20. The monolithic integrated bucket-brigade circuit set forth in claim 11 and further comprising a $p^+$ diffused channel stopper formed at each interface of said dielectric means and said substrate for preventing inversion of the $p^-$-type substrate to n-type.

* * * * *